United States Patent [19]
Gelbart

[11] Patent Number: 6,096,461
[45] Date of Patent: Aug. 1, 2000

[54] LASER EXPOSURE UTILIZING SECONDARY MASK CAPABLE OF CONCENTRATING EXPOSURE LIGHT ONTO PRIMARY MASK

[75] Inventor: Daniel Gelbart, Vancouver, Canada

[73] Assignee: Creo SRL, Burnaby, Canada

[21] Appl. No.: 09/228,078

[22] Filed: Jan. 6, 1999

[51] Int. Cl.[7] ...................................................... G03F 9/00
[52] U.S. Cl. ........................... 430/30; 430/396; 430/397; 430/945
[58] Field of Search .............................. 430/30, 396, 397, 430/945

[56] References Cited

U.S. PATENT DOCUMENTS

| | | | |
|---|---|---|---|
| 4,988,188 | 1/1991 | Ohta | 353/122 |
| 5,059,008 | 10/1991 | Flood et al. | 359/196 |
| 5,650,876 | 7/1997 | Davies et al. | 359/622 |

OTHER PUBLICATIONS

"Simulation and Experimental Evaluation of Double Exposure Thechnique" pp. 372–377 SPIE vol. 3334 (1998).
"New Method to Improve the Practical Resolution of Complex Pattern in Sub–half Micron Lithography" pp. 567–575 SPIE vol. 3334 (1998).

*Primary Examiner*—Christopher G. Young
*Attorney, Agent, or Firm*—Oyen Wiggs Green & Mutala

[57] ABSTRACT

A method and apparatus for high resolution imaging of integrated circuits and flat panel displays uses a pulsed laser source, a thermoresist coated image receiving surface and a pair of masks. A primary mask carries the principal image and a secondary mask containing an array of lenslets which concentrate light from the source onto a subset of the features of the primary mask. The secondary mask lenslets are dimensioned so as to illuminate a subset of the features with a known pitch and form an image corresponding to the subset on the thermoresist. After creating a subset image, the secondary mask is moved so as to expose another subset of the features and form another subset image. In this manner, the entire principal image is reconstructed on the thermoresist from subset images. The secondary mask is moved on two axes by a plurality of piezo-electric actuators. Registration and position control of the secondary mask are accomplished by including positioning marks on the primary mask and a photo-detector to resolve the positioning marks and provide position feedback. To increase the power density imparted on the image receiving surface, the laser source may be focused into a concentrated scanning line, which is scanned across the secondary mask so as to further divide the imaging process, while providing additional power density.

9 Claims, 6 Drawing Sheets

LASER EXPOSURE UTILIZING SECONDARY MASK CAPABLE OF CONCENTRATING EXPOSURE LIGHT ONTO PRIMARY MASK

RELATED APPLICATIONS

This application is related to co-owned, co-pending U.S. application Ser. No. 09/110,378, which is hereby incorporated by reference.

FIELD OF THE INVENTION

The invention relates to the high resolution imaging of an etch resistant layer, commonly referred to as a "resist". A resist is used to fabricate patterns by etching or deposition. In particular, the invention relates to the manufacturing of integrated circuits and flat panel displays using a series of masks in an optical stepper. A stepper is an imaging device used in the semiconductor industry to project an image of a mask onto a semiconductor wafer.

BACKGROUND OF THE INVENTION

Today, most integrated circuits are fabricated using an imaging device known as a "stepper". The stepper images a pattern carried by a mask onto the image receiving surface, allowing subsequent selective etching or deposition. The process of fabricating high resolution patterns on planar objects by selective etching and deposition is well known in the art. Typical processes are described below.

In general, the image receiving surface is covered by a protective layer known as a "resist". The desired image, carried by a mask, is recreated on the resist, via photoexposure. The exposed parts of the resist (or possibly the unexposed parts for negative working resists) are removed, using a liquid or plasma developer. The imagewise removal of the resist uncovers the underlying material, which can now be etched through the openings in the resist layer while the resist protects the material still covered. Etching techniques include wet chemicals or dry plasma (a process widely adopted in the semiconductor industry). An alternative to etching, entails an additive process, a "deposition", where a substance is deposited through the openings in the resist, adding to the underlying material. Techniques for deposition include wet processes (used in the production of printed circuit boards) or dry processes, such as vacuum deposition by evaporation or sputtering. Another technique for exploiting the imaged resist involves chemical reactions, such as oxidation, which occur only in the bare areas not covered by resist. After the etching, deposition, or oxidation, the remaining resist is normally removed.

Generally, resists are imagewise masks, which selectively control a chemical or physical process, forcing the process to occur in accordance with the imaged pattern. In some processes the imagewise patterned layer is not a resist at all but a functional layer which is not removed. Such functional layers can be selective direct imaging of insulators and conductors. While these are not "masks", they will be referred by the generic term "resist". The term "resist" should be interpreted in this broad sense, to mean any patterned layer imaged by radiation, throughout the disclosure and the claims of this application.

Historically, most resist were photoresists. Photoresists are activated and imaged by the photonic action of light. For this reason, most imaging systems operate in the UV part of the spectrum, where the photon energy is high. Some resists are exposed by other types of radiation, such as electron beams. All photoresists and electron beam resists share one fundamental property; they respond to the total exposure, not the momentary illumination. In optics, total exposure is defined as the linear integral of illumination over time. For example, a photoresist can be exposed by an illumination of 100 mW/cm$^2$ for a time of 1 second to yield an exposure of 100 mJ/cm$^2$, or equivalently, can be exposed by 1000 mW/cm$^2$ for 0.1 seconds to yield the same total exposure. This phenomenon is known as the "reciprocity law" and governs the exposure of photo and electron beam resists.

With respect to the accumulation of total exposure, photo and electron beam resists behave according to a linear function of power and time. Accordingly, the principle of linear superposition also applies to photo and electron beam resists. Superposition implies that f(a+b)=f(a)+f(b). In other words, the exposure response of the system to an illumination made up of multiple parts is equal to the sum of the exposure responses of the system to each part, as if it was applied separately. In making this statement secondary effects such as coherence of the light source are ignored. Clearly multiple exposures will have an effect on the coherence but this effect is secondary compared to linear superposition.

When a certain threshold total exposure is reached, a chemical change occurs in the resist. Commonly, the chemical changes in resists involve changes in their solubilities with respect to a particular developing solution.

Because of the superposition principle and the reciprocity law, photo and electron beam resists also require high contrast ratios and low stray light. For example, an imaging system may have light leakage, or stray light, of 1% (i.e. when the illumination is "off", the light level does not drop to zero, but only to 1% of the "on" state). If left on the photoresist for a long period of time, the effect of this stray light can be as large (or larger) than that of the main exposure. An even larger problem is caused when trying to image high resolution features; the point spread function of the optical system causes a "spreading" of light from each feature which causes overlap with adjacent features, effectively reducing the resolution. The reduction in resolution, is particularly severe in the semiconductor industry, where steppers are used to image increasingly high resolution features onto semiconductor wafers. For further details on microlithography and the operation of steppers, any modern book on the subject can be consulted, such as: "Handbook of Microlithography, Micromachining, and Microfabrication", Volume 1 and 2, editted by P. Rai-Choudhury, SPIE Press 1997, ISBN 0-8194-2378-5 (V.1) and 08-8194-2379-3 (V.2).

Recently, a different type of resist, known as a thermoresist, has been developed for use in the manufacturing of printing plates and printed circuit boards. A thermoresist (also known as a thermal resist or heat-mode resist) changes solubility when a certain temperature, rather than a certain accumulated exposure, has been reached. Such thermoresists are typically imaged using near infra-red light and have, therefore, also become known as "IR resists". Thermoresists respond to temperature and do not obey the reciprocity law or the principle of superposition. In contrast to a photoresist, which will be exposed by prolonged exposure to ambient light, a thermoresist does not follow the reciprocity law and, consequently, will not be exposed by prolonged exposure to ambient temperature. While a photoresist can be shielded from ambient light, it is both inconvenient and expensive. Advantageously, prolonged exposure of a thermoresist to ambient temperature below the threshold temperature has little effect. Obviously, the threshold temperature needs to be well above the temperatures encountered in shipping and storage. When the chemical reaction in a thermoresist does not have a sharp threshold temperature, the chemical composition has to be formulated to keep the reaction rate very low at room temperature. Such a chemical composition is not difficult to create, as a large number of chemical reaction rates double for approximately every 10 degrees centigrade increase; thus, reaction rate in a thermoresist exposed at 350 degrees centigrade can be a billion times faster than at 25 degrees. Laser sources make it fairly easy to raise the temperature of the thermoresist to over 1000 degrees. Such a thermoresist will appear to have a distinct threshold simply because the reaction rate at a lower temperature slows down exponentially. In contrast, a material obeying the reciprocity law would have a reaction rate which varies linearly with temperature; however, the chemical compositions typically used in thermoresists do not possess such a linear relationship. The present invention exploits these thermoresists and their deviation from the reciprocity law.

The invention also exploits the fact that the exposure of thermoresists is a non-linear process (i.e. not a linear integral over time). Thermoresist materials are non-linear because of the way that any stray heat will dissipate quickly from the surface of the material. The lack of linearity can also be exploited to improve the image resolution by dividing the principal image into multiple image components or "subsets". Each subset image will produce a great deal of heat (i.e. an amount well above the thermoresist threshold) in the areas to be imaged and a small amount of "stray heat" in undesired areas. If the stray heat produced is insufficient to cause the material to reach the threshold temperature, then no exposure of the thermoresist will occur in the undesired areas. After each subset image is formed, the heat can be allowed to dissipate from the undesired areas, leaving them substantially unchanged. Consequently, multiple images can be created without compounding (i.e. adding up) the stray exposure in the undesired areas. In contrast, the exposure of photoresist is a linear process and the stray light in undesired areas would be compounded when creating overlapping multiple images. Separating the principal image into multiple image subsets reduces the performance requirements of other elements of the imaging system and effectively increases the resolution on the imaging process. The image separation process is explained in the Ser. No. 09/110,378 application, but for the sake of clarity and completeness will be explained below.

The primary mask carrying the principal image is divided into a two dimensional array of "cells". Throughout this application, the words "cell" or "cells" should be understood to correspond to a two dimensional area on the primary mask. The size of the cells on the primary mask correspond to the "minimum feature size" of the principal image. A "feature" is a characteristic of the image. The "minimum feature size" is the smallest feature on the image, but it may contain several "pixels". "Pixels" are the smallest addressable location on an image and consequently represent the finest available system resolution. For example, if the image contains one micron lines generated with a 0.1 micron addressability, a pixel will be 0.1 micron, but the smallest feature will be 1 micron. Throughout this application, the words "pixel" and "feature" should be understood to correspond to characteristics of the image. With these definitions in mind, it can be seen that the primary mask may be divided into cells containing several pixels, but the cells may be as small as one pixel.

After dividing the primary mask into a two dimensional array of cells, multiple component images are created by selectively illuminating subsets of cells on the primary mask. The Ser. No. 09/110,378 application discusses several embodiments where the preferred subsets of cells include every second or third cell on the primary mask. The distance separating cells illuminated in the same subset is referred to throughout this application as the "pitch". For example, where the subset of cells illuminated is every third one, then the pitch of the subset is three.

The Ser. No. 09/110,378 application discusses how a secondary mask can be used to selectively illuminate the subsets of cells on the primary mask and thereby create the multiple component images. This process is depicted schematically in FIG. 1. Secondary mask 1 contains a series of evenly spaced openings 5 (with a pitch of three) which transmit light. The secondary mask 1 is normally fabricated by etching these openings 5 in chrome coated glass. The openings 5 are sized and spaced so as to illuminate one cell (a, b, c, d, e, f, g, h, i, j, k) on the primary mask 2, carrying the image to be reproduced. Light from the laser (not shown) illuminates secondary mask 1 (in position 1A) and impinges on cells c, f, and i of the primary mask 2. The primary mask 2 carries image 6 and imagewise blocks some of the laser light. The resultant heat distribution on the thermoresist (when secondary mask 1 is in position 1A) is shown in graph 3A. Where the temperature is above the threshold temperature t, the thermoresist is exposed, undergoing a chemical change. Note that the thermoresist depicted in FIG. 1 is ideal for simplicity. The period of illumination must be extremely brief (nanoseconds to microseconds) to prevent heat from escaping the substrate. For this reason a pulsed laser source (not shown) is a suitable source. The resulting exposure pattern (i.e. the component image) 7A is depicted in plot 4A. Notice that the component image 7A does not show the effects of the stray heat which falls outside of the cells c, f, and i and/or outside of the image pattern 6 on the primary mask 2. Because the stray heat was below the threshold level t and the thermoresist does not obey the reciprocity law, the regions impacted by stray heat will cool down and act as if they never experienced the heat. The thermal time constant of typical thermoresist layers is in the range of a few microseconds.

After a short delay (i.e. to allow the stray heat to dissipate), secondary mask 1 is moved to position 1B such that openings 5 are positioned over cells b, e, h, and k. The resultant heat distribution is depicted in graph 3B and the cumulative resultant exposure pattern is depicted in plot 4B which shows the combination of component image 7A and component image 7B. Finally a third component image 7C is created with the secondary mask 1 in position 1C over primary mask cells a, d, g, and j. The resultant heat distribution is depicted in graph 3C and the cumulative resultant component image 7A, 7B, and 7C is depicted in plot 4C. It can be seen clearly from plot 4C that the total exposure is representative of the image 6 on the primary mask 2.

The primary mask, like any other digital image, is based on a grid of cells. FIG. 2 depicts a two-dimensional secondary mask 1 according to the '378 application. The secondary mask is divided into cells, which correspond to grid of the primary mask or a multiple thereof. The pitch of the secondary mask in FIG. 2 is three, that is it has openings 8, which allow light through to illuminate every third cell on the primary mask.

The benefit of making the image subsets exposures independently will become obvious from FIG. 3. In order to image the primary mask 2 in a prior art, single image process, the resolution of the lens (not shown) between the primary mask 2 and the thermoresist (not shown) had to be sufficient to cause the light change resulting from the smallest image feature on the primary mask to exceed 50% of the light change caused by the largest feature. The relationship of graph 10 and threshold 11 depicts this requirement. Graph 10 represents the response at the image receiving photoresist or thermoresist during a prior art, single image process. The response corresponds roughly with both the exposure and the temperature at the thermoresist surface. To resolve the smallest individual transparent image feature (or opening) 2', the corresponding response at the image receiving thermoresist 10' has to exceed the threshold 11. At the same time, overall system power density cannot be increased, otherwise the smallest opaque image feature 2" will not be able to maintain the corresponding response on the image receiving thermoresist 10" below the threshold 11. This tradeoff also represents the reason that threshold 11 should be placed roughly at the midpoint between the exposure level generated by the largest opaque area (nearly zero) and the exposure level generated by the largest transparent area (shown as 100% in FIG. 3). Any attempt to improve the reproduction of feature 2' will be at the expense of feature 2".

The problem is completely solved by the '378 invention if the primary mask 2 image can be subdivided into cells having a cell size equal to the smallest image feature 2'. In this manner, the primary mask image 2 can be recreated using multiple image subsets, each one containing a subset of evenly spaced cells. If all of the cells are of the same size and are sufficiently separated, even a response which is a fraction of the 100% level in FIG. 3 can be used by increasing the overall system power density. For example, assume that the secondary mask contains openings with a pitch of two. If the exposure created (when the secondary mask is at position 1A) only reaches the level shown as A in graph 10A of FIG. 2 (due to limited resolution of the optical system), then the total power of the laser source (not shown) can be raised until graph 10A is scaled up to graph 14, crossing threshold 11 to generate the correct feature size W. Then, the secondary mask is moved to position 1B for the second exposure, and graph 10B is scaled up the same fashion.

The interaction between features 2' and 2" is now minimal for two reasons. First, adjacent image features on the primary mask 2 are exposed during different images. Because the minimum image feature size and the size of the cells on the primary mask 2 are equal, any feature located within a cell will be spaced at least one cell width from an adjacent feature. Since the secondary mask 1 (in FIG. 2) provides illumination to evenly spaced cells at a pitch of more than one (i.e. adjacent cells are never illuminated in the same image subset), only a single image feature may occur within a particular cell of an image subset and adjacent image features are exposed during different images. Secondly, any heat energy below the thermoresist threshold is dissipated before an adjacent feature is imaged, minimizing the interaction between features provided (as is always the case), that the thermoresist does not obey the reciprocity law.

In theory, response level A can be a very small fraction of the response 10' and 10" required from prior art, single image steppers. In practice, the level A is limited by the interaction between features. The smaller response A is, the further apart the illuminated cells of the primary mask need to be separated (i.e. the higher the pitch must be) to avoid interaction between "neighboring" cells of a component image. Such large separation may require a secondary mask with a pitch of four or five. Reducing the response level A in FIG. 3 corresponds to a lower cell size and a larger pitch, thereby offering high resolution because the cell size corresponds to the minimum feature size. It is well known that the density of integrated circuits requires the use of the smallest features possible; this corresponds to a small A value.

FIG. 4 shows an example of separating a primary mask image 2 into four image subsets 2A, 2B, 2C, and 2D. The minimum features are the same size as the cells and are separated from each other by at least one cell. Obviously, other schemes of separating the image into subsets which are easier to reproduce can be used. An alternate method is to image all large features in a single image, in order to take advantage of the higher throughput of larger features, and then construct separate subset images for fine features. In FIG. 4, the image is divided into odd and even cells as is shown by insert 15. The secondary mask (not shown) used to develop the four component images has a pitch of two. Image subset 2A was imaged when the secondary mask was positioned so as to illuminate a subset of cells including odd rows and columns. Similarly, 2B contains odd rows and even columns, 2C contains even rows and odd columns and 2D contains even rows and columns.

It should be noted that the method of separating the principal image into subsets also improves the resolution of a system using photoresist as opposed to thermoresist. It is well known that increasing the coherence of the imaging process reduces the resolution. Separating images and them summing them according to the prior art invention increases the coherence of the process and, accordingly, resolution is increased. These improvements, however, are small compared to the main improvement generated by the effects of working outside the realm of linear superposition.

Several other factors are important to the techniques of separating principal images into image subsets. The use of image subsets at high resolutions requires thin resists to avoid thermal lateral diffusion, which can reduce resolution. Vertical thermal diffusion does not affect resolution. Thin resists are more compatible with excimer lasers, which are absorbed preferentially in the top layer of thicker resists. Inorganic thermoresists are particularly well suited for present invention. The imaging process uses pulsed light sources, so as to help reduce thermal diffusion by keeping pulses under a few microseconds.

A problem with the aforementioned use of secondary masks containing a number of evenly spaced openings (see 8 in FIG. 2) is that a significant percentage of the light from the laser source is blocked at the secondary mask and does not make it through the apparatus so as to contribute to the imaging process. This waste of light energy reduces the imaging efficiency of the system and increases the exposure time required to generate an image subset. Accordingly, it is an object of the present invention to improve the optical transmission of the secondary mask.

In the prior art process, register must be maintained between the different masks and images. However, maintaining the registration of the primary mask to the image is part of stepper design and is a required feature in today's steppers. The secondary mask however, must be moved in suitable increments relative to the primary mask, so as to permit illumination of the various subsets of cells on the primary mask and create the corresponding component images. It is a further object of this invention to provide for a method and apparatus operative to move the secondary mask on two axes, while maintaining precise control of its position and registration.

Another object of the present invention is to provide a method and apparatus to further increase the power density (exposure) imparted to the image receiving thermoresist.

SUMMARY OF THE INVENTION

The invention involves an apparatus which is insertable into a path of incident laser light and is operable to divide a principal image, contained on a primary mask, into a plurality of image subsets. The apparatus comprises a secondary mask with optical elements, shaped and positioned in manner so as to focus light on a portion of the primary mask. Being a digital image the primary mask is divided into a plurality of cells, such that the portion of the primary mask which is illuminated is a subset of cells. As previously explained a cell can be one or more pixels. The apparatus also comprises a plurality of actuators operative to move the secondary mask on a two-dimensional plane above the primary mask and a registration and position control system, which, in conjunction with the actuators, is operative to effect control of the position of the secondary mask relative to the primary mask.

Advantageously, the secondary mask may comprise a two dimensional array of lenslets and the actuators may be piezo-electric actuators. The apparatus may contain at least two actuators responsible for one axis on said two-dimensional plane to control rotation.

The registration and position control system may further comprise a plurality of sets of position markings located on edges of the primary mask. Each set of markings is operative to receive incident light and to create a transmission pattern which is received by a plurality of photodetectors, each positioned behind a set of the markings. The photodetectors detect the light transmitted by the position markings and send the detected signal to comparing amplifiers, which control the actuators.

Advantageously, the registration and position control system may also comprises plurality of external light sources, operative to specifically illuminate the sets of linear position markings.

Preferably, the principal image is recreated on an image receiving surface which is a thermoresist layer, however the invention can also be used with photoresists to a lesser advantage.

A second aspect of this invention involves a method of using a laser source to image a principal image, carried on a primary mask, onto an image receiving surface. The method comprises dividing the principal image into a two-dimensional array of cells and introducing a secondary mask in a certain position between the laser source and the primary mask. The secondary mask comprises optical elements which focus the light. The next step involves exposing an image subset onto the image receiving surface by shining light from said laser source towards said secondary mask. The position of the secondary mask causes the light to be focused onto a particular subset of the two-dimensional array of cells contained on the primary mask. Consequently, the image created contains only the image features within the subset of cells. The next step involves moving the secondary mask relative to the primary mask on a two-dimensional plane. Finally, the exposing step and the repeating step are repeated so as to form a complete image on the image receiving surface. The complete image is formed by exposing each subset of cells of the two-dimensional array of cells on the primary mask with each subset of cells forming an image subset containing the image features from the particular subset. The combination of the image subsets forms the complete image on the receiving surface.

Advantageously, the secondary mask may comprise a two dimensional array of lenslets and the movement step may be accomplished by a number of piezo-electric actuators. The image receiving surface may be a thermoresist or a photoresist.

Preferably, the laser source may be pulsed at very short pulses.

The exposing step and the movement step can be discrete so as to form a distinct component image with each exposing step. Alternatively, the exposing step and the movement step may be occurring continuously throughout the imaging process.

The exposing step may be further sub-divided by inserting an optical processing system between the laser source and the secondary mask, so as to concentrate a significant amount of light from the source onto part of said mask. Concentrating the light onto a fraction of the secondary mask increases the power density.

Advantageously, the pattern of concentrated light may be a line.

DESCRIPTION OF THE PREFERRED EMBODIMENT

Figure 1:
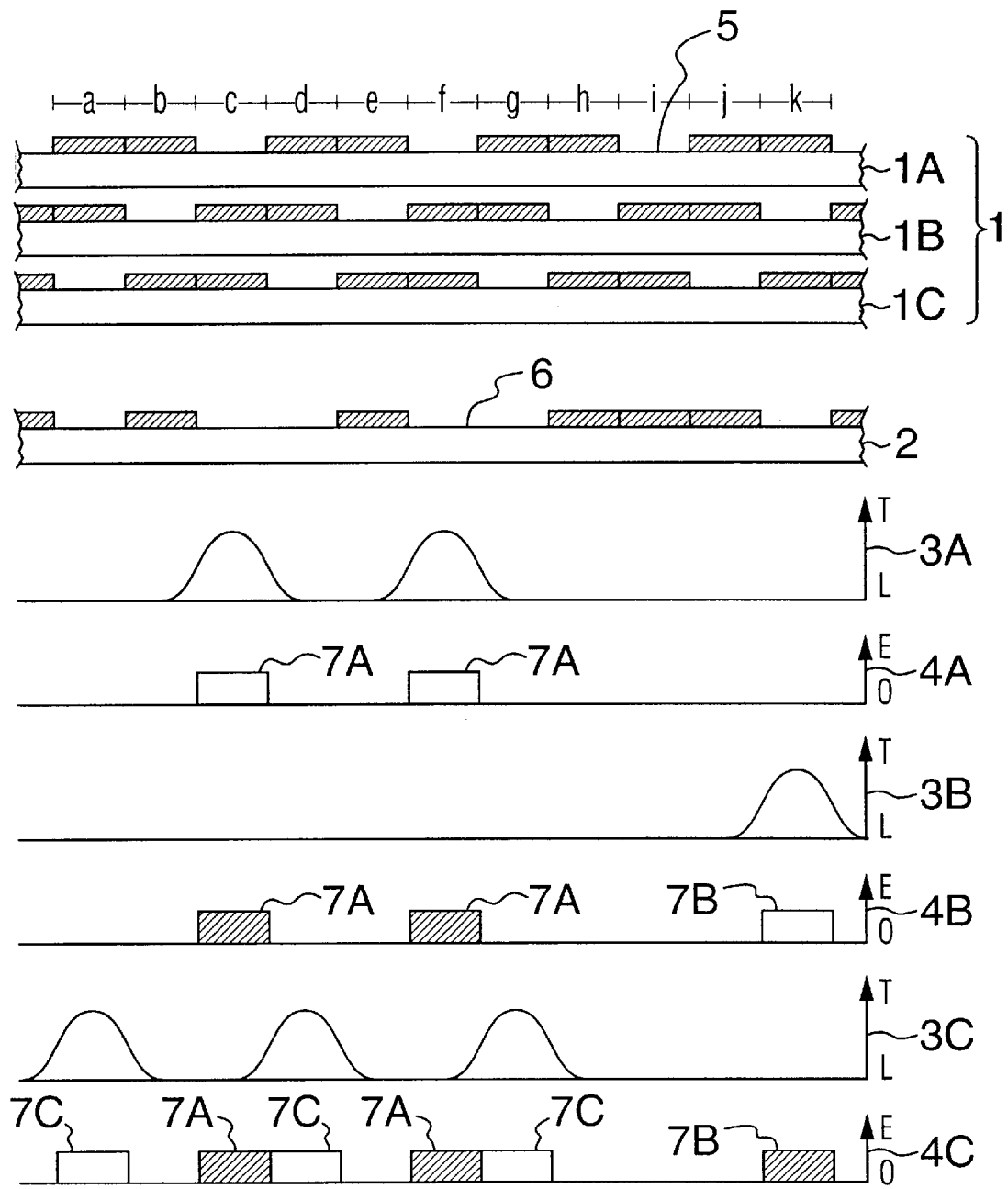
FIG. 1 depicts the process of dividing the principal image on the primary mask into a number of component images.
Figure 2:
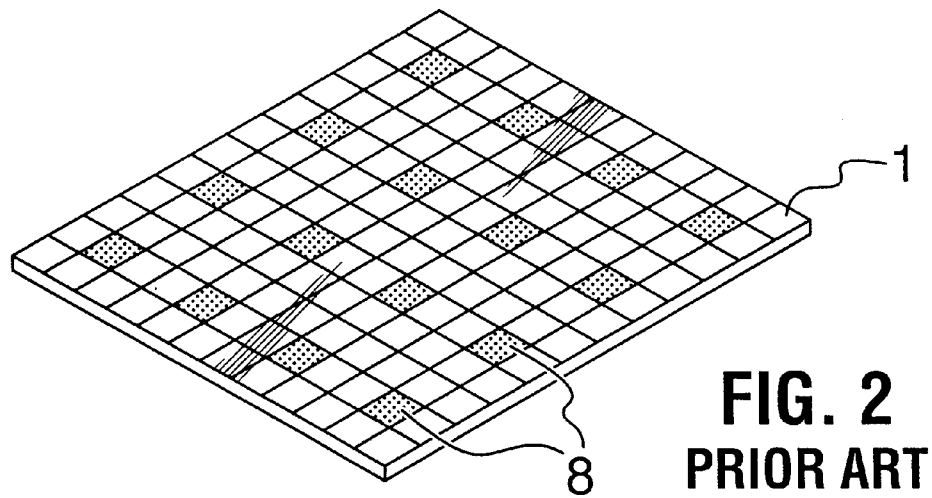
FIG. 2 depicts a prior art secondary mask containing openings with a pitch of three.
Figure 3:
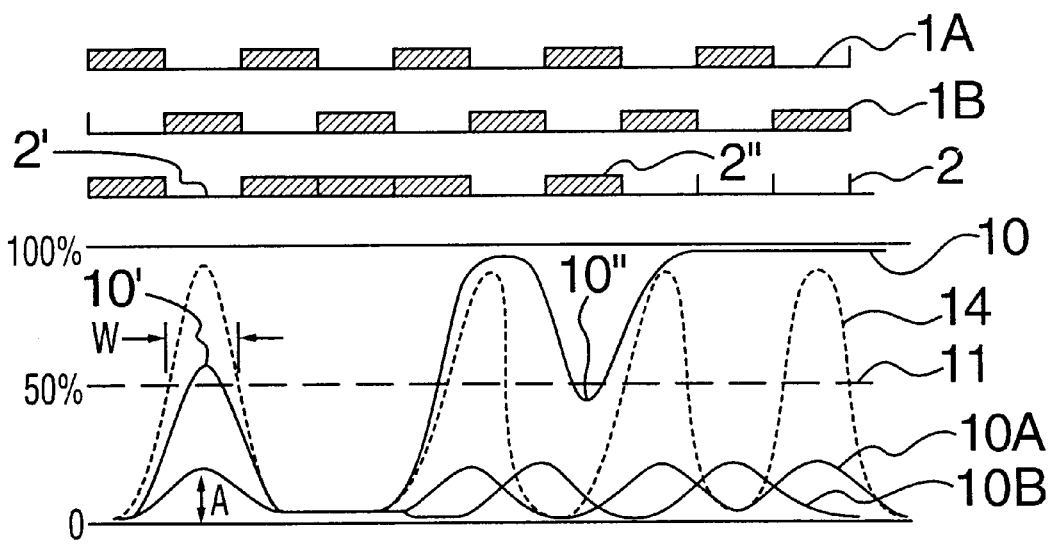
FIG. 3 shows the advantages gained from dividing the principal image into component images.
Figure 4:
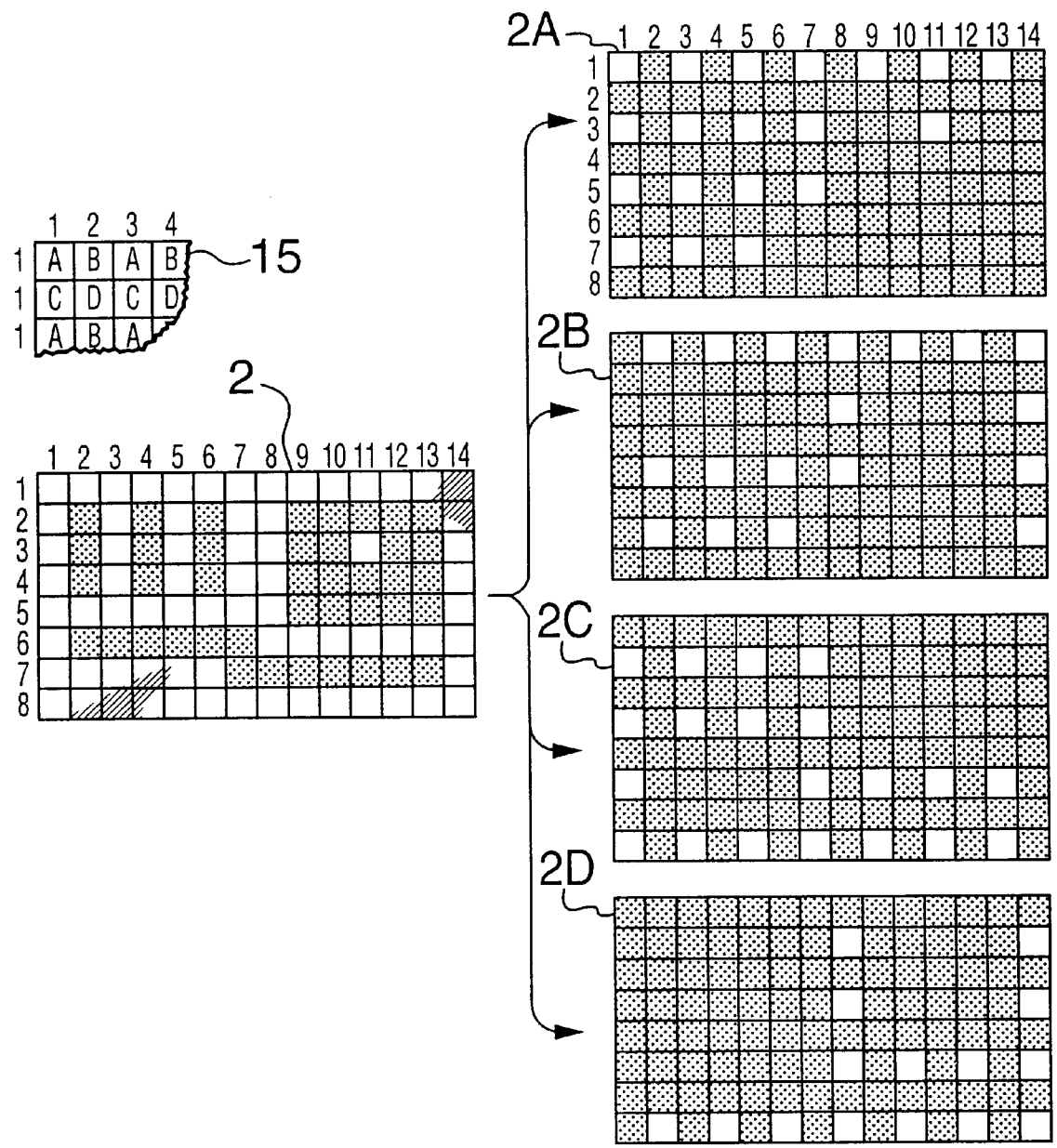
FIG. 4 shows a the four component images that comprise a principal image.
Figure 5:
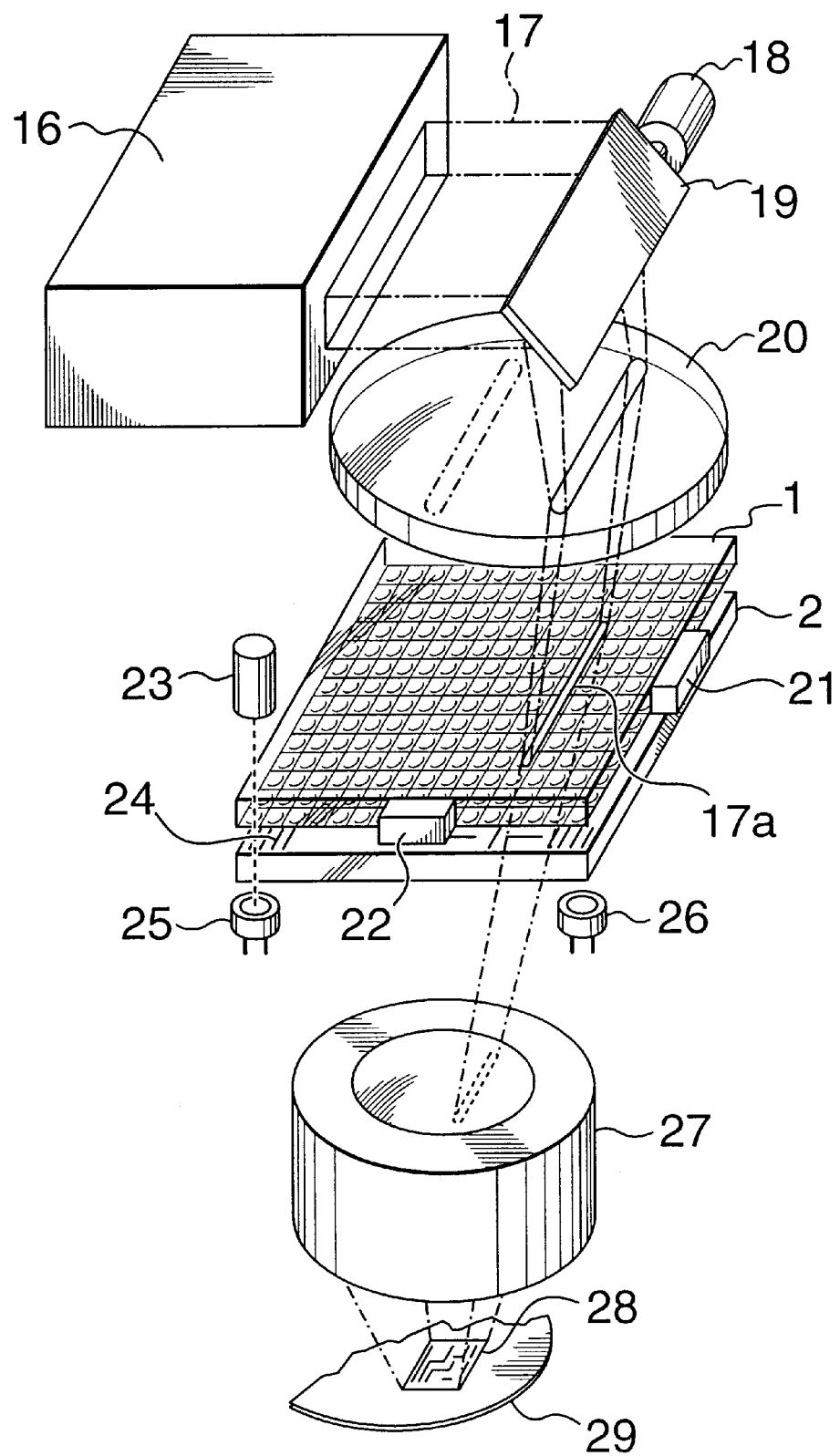
FIG. 5 depicts the present invention as configured within an optical stepper.
Figure 6:
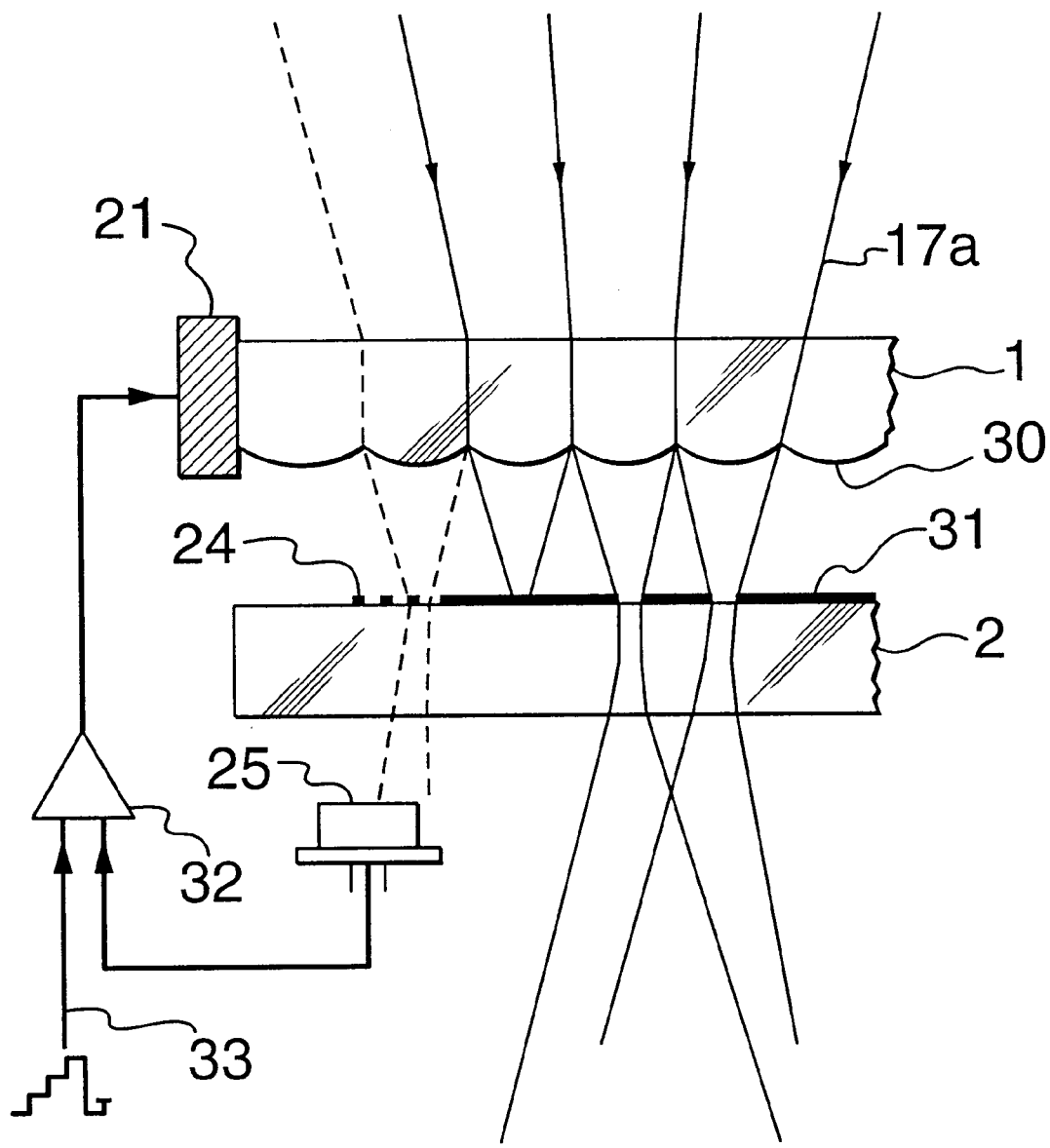
FIG. 6 is a cross sectional depiction of the lenslet array according to the present invention and the elements of the position and registration control system.

The preferred embodiment of the invention is depicted in FIGS. 5 and 6. Referring now to FIGS. 5 and 6, the invention uses a two dimensional array of lenslets 30 as the secondary mask 2. Instead of attenuating the power density of light (in a manner similar to the prior art secondary mask 1 of FIG. 2), the lenslet array mask 1 of the invention actually concentrates light energy onto a subset of cells on the primary mask 2. As can be seen from FIG. 5, when the secondary mask 2 is in a given position, the light 17a which is collected by the lenslets 30 of the secondary mask 1, is focused on a particular subset of cells on the primary mask 2. Typically, the lenslets 30 are shaped and the position of the secondary mask 2 is configured such that the subset of cells illuminated represents a certain pitch on the primary mask 2. Primary mask 2 carries the principal image 31. When light 17a travels through the subset of cells on the primary mask 2, it goes on to form an image subset (not shown) on the semiconductor wafer 10. The separation between lenslets 30 and image 31 is determined by the focal length of the lenslets 30, which in turn is determined by the required numerical aperture of lens 27.

If the light impinging on the secondary mask 1 is not collimated, then the pitch of lenslets 30 must increase as the lenslets 30 are located further from the primary mask 2 so as to maintain the proper pitch on the primary mask 2. By controlling the magnification, dimensions and numerical aperture of the lenslets 30 and the distance between the two masks (1 and 2) the location of the light striking the primary mask 2 (i.e. the subset of cells) can he controlled precisely. Obviously, the collection of light is not limited to the use of lenses, and any method of concentrating light, such as diffractive or reflective optics, may be used in the secondary mask 1.

After an image subset is formed, then the secondary mask 1 is moved so as to form another image subset by imaging a different subset of cells on primary mask 2. The movement of the secondary mask is performed by a plurality of piezo-electric actuators 21 and 22. Electrical signals from amplifier 32 are used to control the piezo-electric actuators 21. Piezo-electric actuators are commercially available from Lambda Physique (Germany)and many other suppliers.

Figure 7:
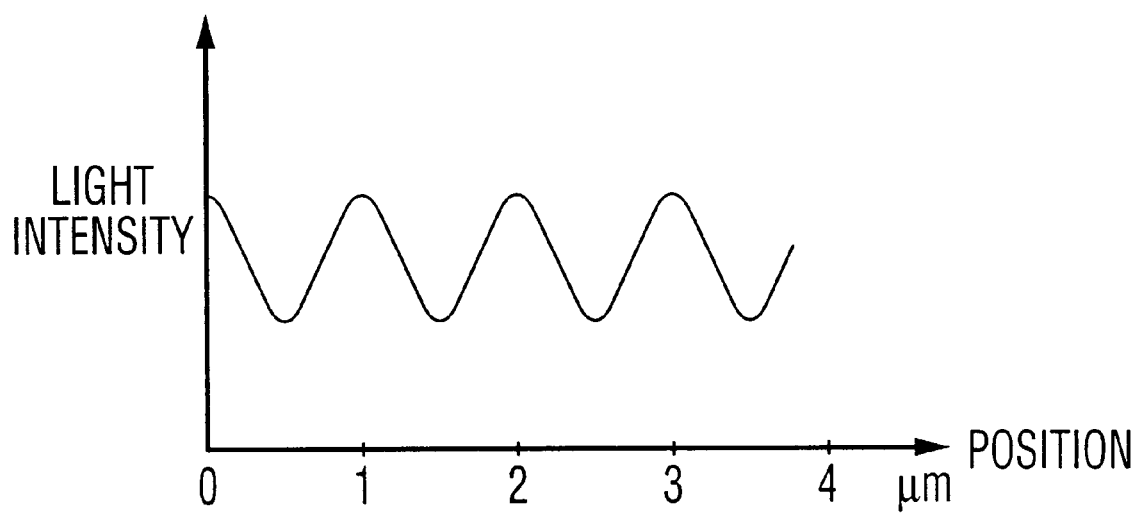
FIG. 7 depicts the light intensity response of the photodetectors positioned underneath the linear position markings.

Referring to FIGS. 5 and 6, the registration and position control of the secondary mask 1 is accomplished using a system comprising the piezo-electric actuators 21,22 photo-detector 25, amplifier 32 and, preferably, linear grating markings 24 located at the edges of the primary mask 2. The registration and position control system may also include an optional secondary light source 23. The key to the registration and position control system is the linear grating 24 which has a line width and spacing width equal to the cell dimensions on the primary mask 2. When light travels through secondary mask 1, it will be focused down to the size of a single cell when it strikes the grating 24 on the primary mask 2. The signal received at photo-detector 25 is depicted in FIG. 7. When the cell sized spots of light are focused onto an opaque line, then the resulting light intensity (FIG. 7) at the photo-detector 25 will be at a minimum. Conversely, when the cell sized spots of light is on a space, then the resulting light intensity (FIG. 7) at the photo-detector 25 will be a maximum. In this manner, the photo-detector 25 is able to detect whether the secondary mask 1 is properly registered. The photo-detector 25 output is fed to comparing amplifier 32 which controls the piezo-electric actuators 21. Once a first peak is located, then the secondary mask is registered and need only be moved in discrete steps corresponding to the dimensions of a single cell. For example, to expose the next image subset, control signal 33 commands actuator 21 to move mask 1 to the next signal maximum of detector 25.

Figure 8:
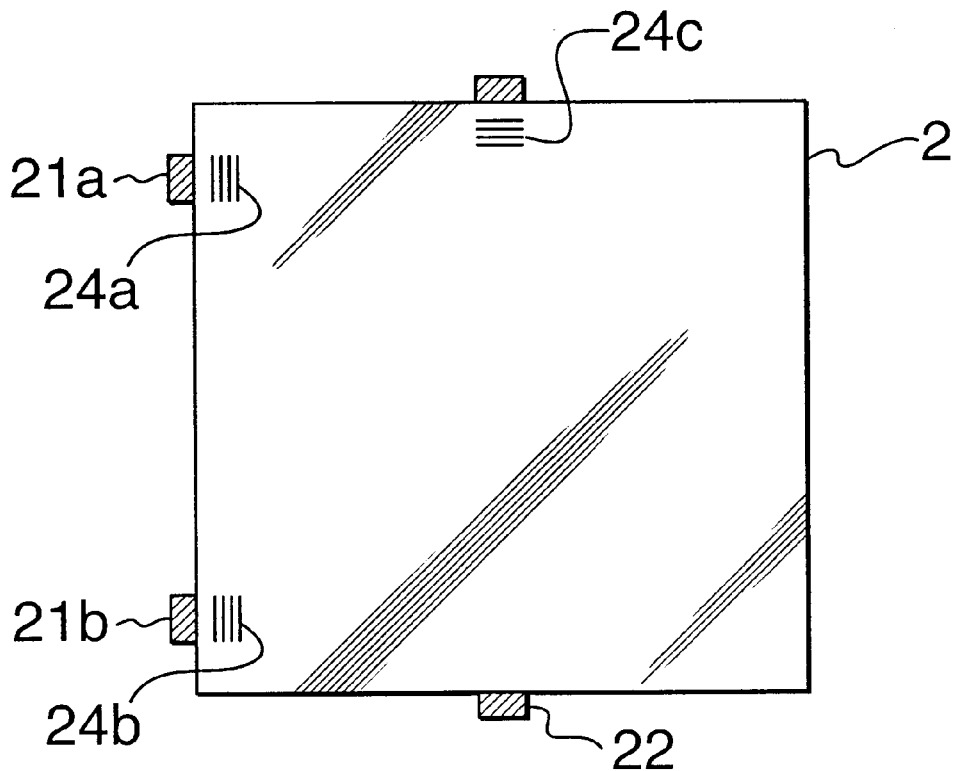
FIG. 8 schematically depicts the position control system showing a plurality of actuators and position markings.

Because the secondary mask 1 must be moved on two axes, control is slightly more complicated than described above. FIG. 8 represents the preferred embodiment. The need to control rotation makes is desirable to have at least two actuators, (21a and 21b), two sensors (not shown), and two sets of position markings (24a and 24b) for at least one axis. This system enables registration and position control on both axes at several locations on the secondary mask and can control rotation of the mask during movement. While FIG. 5 and FIG. 6 show detector 25 measuring the transmitted light it is understood that any other position detection such as reflected or non-optical position sensor can be used.

FIG. 5 depicts an implementation of the apparatus within an optical stepper. Secondary mask 1 is positioned over primary mask 2. Piezo-electric actuators 21 and 22 are positioned on each axis of the secondary mask (note: only one is shown on each axis for simplicity) The registration and position control system is also represented in FIG. 5 by photo-detectors 25 and 26 located under position markings 24 and an optional secondary light source 23. Also shown in this diagram is the imaging lens 27 which images the light emerging from the primary mask 2 onto die 28 of wafer 29 which is coated with thermoresist (not shown).

FIG. 5 also shows an additional technique that can be used to further concentrate the intensity of light in the system. Laser 16 is typically a pulse excimer laser, such as one made by Cymer Inc. (Ca., USA) operating at wavelengths of 248 nm or 193 nm and pulsing at 2 kHz with a pulse energy of 10 mJ/pulse. The additional technique involves optically scanning the laser by mirror 19 mounted on actuator 18 and concentrating the laser light 17, using optical elements 20 so that the light 17a incident on the secondary mask 1 forms a line of width 0.1–1 mm. The line of light 17a may then be scanned across the surface of secondary mask 6. In the preferred embodiment actuator 18 is a galvonometer and element 20 is a lens. According to this process, a single image subset(not shown) formed from a subset of cells on the primary mask 2 would require that the line of light 17a be completely scanned across the width of secondary mask 2 (i.e. a complete scan of the secondary mask 2, by the line of light 17a, would be required for each image subset). At the expense of slightly more time for each image subset, this technique would greatly increase the power density of the light received at the thermoresist (not shown) on the surface of the die 9.

The scan rate of the line is constrained by the width of the line and the laser pulse rate. At least one pulse must be delivered to each cell of mask 2. For example, for a line of width 1 mm, and a 1 kHz pulse rate, the scan rate must be less than 1 mm/ms. All of these parameters can be adjusted easily for optimum performance. This technique is not constrained to "line shapes". Any manner or shape in which the light is concentrated before striking the secondary mask 1 and then scanned across its surface should be considered a part of this invention. The newer generation of steppers, known as "step and scan" devices are particularly suitable for this invention as many parts of the scanning optics are already provided, and the illumination of the mask is already in the form of a line.

The prior art methods of dividing a principal image into component images involves discrete component images formed by moving the secondary mask in discrete increments proportional to one cell on the primary mask. Since the invention of the prior art, it has been discovered that the there are some advantages to be gained from moving the secondary mask continuously as opposed to discretely. Combining a continuously moving secondary mask with a rapidly pulsing laser can eliminate the "ripple" effect caused by discrete imaging and create smoother images on the image receiving thermoresist. Obviously, the pulse rate of the laser, the movement rate of the secondary mask and the size of the lenslets in the secondary mask are not all independent of one another, since a properly constructed image requires at least one pulse per cell on the primary mask.

What is claimed is:

1. A method of using a laser source to image a principal image, carried on a primary mask, onto an image receiving surface, said method comprising:

(a) dividing said principal image, carried on said primary mask, into a two-dimensional array of cells;

(b) introducing a secondary mask in a certain position between said laser source and said primary mask, said secondary mask comprising optical elements capable of concentrating light;

(c) exposing an image subset onto said image receiving surface by shining light from said laser source towards said secondary mask, the position of said secondary mask causing said secondary mask to concentrate light onto a particular subset of the two-dimensional array of cells on said primary mask, and said subset of cells containing image features which are imparted onto said image subset;

(d) moving said secondary mask parallel to said primary mask; and (e) repeating said exposing step (c) and said moving step (d) a plurality of times, so as to form a complete image on said image receiving surface, said complete image formed by exposing each subset of cells of the two-dimensional array of cells on the primary mask, each subset of cells forming an image subset containing the image features from the particular subset, and each image subset combining to form a complete image on the image receiving surface.

2. A method according to claim 1, wherein said secondary mask comprises a two dimensional array of lenslets.

3. A method according to claim 1, wherein said movement step is accomplished by a number of piezo-electric actuators.

4. A method according to claim 1, wherein said image receiving surface is one of a thermoresist and a photoresist.

5. A method according to claim 1, wherein said laser source is pulsed at a given rate.

6. A method according to claim 1, wherein said exposing step (c) and said moving step (d) are discrete so as to form a distinct component image with each exposing step.

7. A method according to claim 1, wherein said exposing step (c) and said moving step (d) are happening continuously.

8. A method according to claim 1, wherein said exposing step (c) is further divided in a method which comprises:

(a) inserting an optical system between said laser source and said secondary mask, so as to concentrate a significant amount of light from said source into an area, said area occupying only a fraction of said secondary mask, and said area having an increased power density; and (b) controlling said optical processing system so as to scan said area of concentrated light over all parts of said secondary mask, so as to effect said exposing step (c).

9. A method according to claim 8 wherein said area of concentrated light is shaped in the form of a narrow line.

* * * * *